United States Patent [19]
Endo

[11] Patent Number: 5,512,777
[45] Date of Patent: Apr. 30, 1996

[54] SEMICONDUCTOR INTEGRATED CIRCUIT DEVICE HAVING ELEMENTS OF DIFFERENT SWITCHING SPEEDS INTEGRATED ON A SINGLE CHIP

[75] Inventor: Koichi Endo, Tokyo, Japan

[73] Assignee: Kabushiki Kaisha Toshiba, Kawasaki, Japan

[21] Appl. No.: 328,785

[22] Filed: Oct. 28, 1994

[30] Foreign Application Priority Data

Oct. 29, 1993 [JP] Japan .................... 5-272478

[51] Int. Cl.$^6$ .................................. H01L 29/32
[52] U.S. Cl. .................... 257/617; 257/610; 257/611; 257/501
[58] Field of Search ........................ 257/617, 800, 257/501, 523, 610, 611

[56] References Cited

U.S. PATENT DOCUMENTS

| | | | |
|---|---|---|---|
| 4,053,925 | 10/1977 | Burr et al. ................... | 257/617 |
| 4,881,112 | 11/1989 | Matsushita ................... | 257/373 |
| 4,881,115 | 11/1989 | Lesk et al. ................... | 257/501 |
| 4,920,396 | 4/1990 | Shinohara et al. ........... | 257/190 |

FOREIGN PATENT DOCUMENTS 2138275  1/1973  France .
2320636  3/1977  France .

OTHER PUBLICATIONS

Patent Abstracts of Japan, vol. 13, No. 184, (E–751), Apr. 28, 1989 and JP–01–010658, Jan. 1, 1989.

*Primary Examiner*—Robert P. Limanek
*Assistant Examiner*—David B. Hardy
*Attorney, Agent, or Firm*—Oblon, Spivak, McClelland, Maier & Neustadt

[57] ABSTRACT

A semiconductor substrate includes a P-type silicon substrate and an N-type epitaxial silicon layer formed on the substrate. The N-type epitaxial silicon layer is isolatedly separated into first and second N-type island regions by means of a P-type silicon region which extends from the major surface of the epitaxial silicon layer to the substrate. A power element is formed in the first N-type region. The current path of the power element extends in the first N-type island region and in the substrate, i.e., reaches a deep portion of the substrate from the major surface. The logic element is formed in the second N-type island region. The current path of the element extends only in the second N-type island region, i.e., reaches a shallow portion of the substrate from the major surface. A carrier-recombination-center layer is formed in a deep portion of the substrate, and overlaps the current path of the power element. The layer does not influence the current path of the logic element which extends only in a shallow portion of the substrate.

33 Claims, 5 Drawing Sheets

5,512,777

SEMICONDUCTOR INTEGRATED CIRCUIT DEVICE HAVING ELEMENTS OF DIFFERENT SWITCHING SPEEDS INTEGRATED ON A SINGLE CHIP

BACKGROUND OF THE INVENTION

1. Field of the Invention

This invention relates to a semiconductor integrated circuit device in which elements having different switching speeds are integrated on a single chip.

2. Description of the Related Art

A discrete semiconductor device for high power, such as a power MOS transistor or an IGBT, employs a technique for controlling the life time of carriers so as to increase the switching speed. This technique is generally called "life time control". Specifically, the life time control is to form a multiplicity of recombination centers of carriers in a substrate by diffusing heavy metal into the substrate, thereby increasing the rate of extinction of excessive minority carriers and hence the switching speed of the device. A technique for controlling the life time of carriers are described, for example, in B. J. Baliga et al. IEEE Trans. Electron Devices, vol. ED-24, No. 6 pp. 685 (1977). Since this technique enables the recombination centers of carriers to be formed substantially uniform in the substrate, all elements can have short carrier life time.

Although the life time control technique can increase the switching speed, it inevitably reduces the current capacity. This is because the rate of extinction of majority carriers is increased as a result of the forming of the recombination centers of carriers in the substrate. Further, damage (crystal defect) due to life time control reduces the current amplification factor of the device, or changes the threshold voltage of the device.

Since, as described above, there is a trade-off relationship between the increase of switching speed and the security of current capacity, it is difficult for the conventional life time control technique to reconcile them.

In the field of semiconductor integrated circuit devices, there is a tendency to try to integrate, in a single chip, an element for high power and an element constituting a circuit for driving or controlling the element for high power. Such an integrated circuit device is called an "IPD (Intelligent Power Device)", which is described, for example, in R. S. Wrathall et al. IEEE Power Electronics Specialists Conference, pp. 229–233 (1985) and Y. Ohata et al. IEEE Custom Integrated Circuit Conference, pp. 443–446 (1987).

In the semiconductor integrated circuit device of this type, each chip has both an element for increasing the switching speed, i.e., a power-related element (or power system element), and an element from which the influence of the life time control should be prevented (i.e., an element whose current amplification factor and threshold voltage should be accurately adjusted), i.e., a logic-related element (or logic system element).

Actually, however, no technique for simultaneously satisfying a demand for an increase in the switching speed of the power-related element and a demand for reducing the influence of the life time control on the logic-related element has not yet been found.

SUMMARY OF THE INVENTION

It is an object of the invention to provide a semiconductor integrated circuit device in which both a demand for an increase in the operational speed of an element and a demand for reducing the influence of the life time control on another element are satisfied.

It is another object of the invention to provide a semiconductor integrated circuit device in which both a demand for an increase in the switching speed of a power-related element and a demand for reducing the influence of the life time control on a logic-related element are satisfied.

To attain the above objects, there is provided a semiconductor integrated circuit device comprising a semiconductor substrate, a first element formed in the semiconductor substrate and having a first current path in a deep portion of the semiconductor substrate, a second element formed in the semiconductor substrate separated from the first element and having a second current path in a shallow portion of the semiconductor substrate, and a carrier-recombination-center layer formed in a deep portion of the semiconductor substrate.

As described above, the first element (power-related element) having its current path in a deep region and the second element (logic-related element) having its current path in a shallow region are employed in a single semiconductor substrate, and the carrier-recombination-center layer is formed in a deep region. This structure can satisfy a demand for an increase in the switching speed of the first element. Further, since the second element has its current path in a shallow region, current is prevented from flowing in the carrier-recombination-center layer, and hence a demand for reducing the influence of the life time control on the second element can be satisfied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
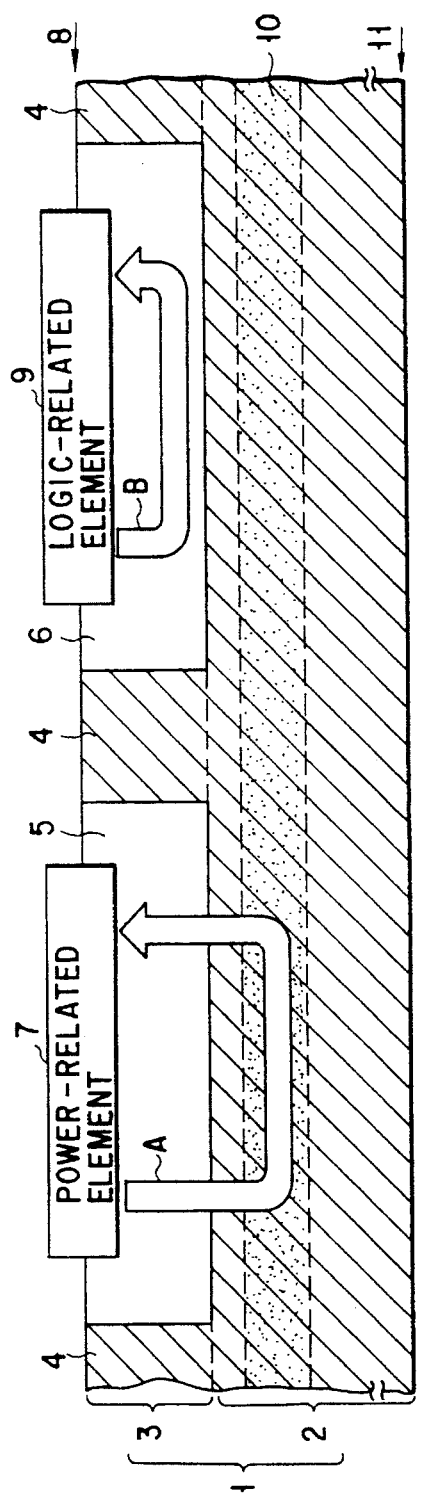
FIG. 1 is a schematic cross sectional view, showing a semiconductor integrated circuit device according to a first embodiment of the invention.

FIG. 1 is a schematic cross sectional view, showing a semiconductor integrated circuit device according to a first embodiment of the invention. Specifically, FIG. 1 shows an IPD (Intelligent Power Device) in which an element for increasing the switching speed and another element for reducing the influence of the life time control are required to effectively operate at the same time.

The IPD comprises two kind of elements incorporated in a single chip—a first element (hereinafter referred to as a "power-related element") which is selected from the group of a power MOS transistor, an IGBT, a diode, etc., produced by discrete semiconductor devices in the prior art; a second element (hereinafter referred to as a "logic-related element") which forms a circuit for driving or controlling the first-mentioned element and is selected from the group of a MOSFET, a bipolar transistor, etc.

In the IPD, in order to save power, the power-related element is required to perform switching at high speed. At the same time, in order to constitute a driving or control circuit, the logic-related element is required to have sufficient drivability or current capacity.

As is shown in FIG. 1, a semiconductor substrate 1 includes a P-type silicon substrate 2, an N-type epitaxial silicon layer 3 formed on the substrate 2, and a P-type silicon region 4 extending from the major surface 8 of the N-type epitaxial silicon layer 3 to the substrate 2 and isolating N-type island regions 5 and 6 from each other. The N-type island region 5 has a power-related element 7 formed therein. The current path A of the power-related element 7 extends from within the region 5 into the substrate 2. As viewed from the major surface 8, the current path A reaches a deep portion of the substrate 1. Further, the N-type island region 6 has a logic-related element 9 formed therein. The current path B of the element 9 extends only in the N-type island region 6. In other words, the path B extends only in a shallow portion of the substrate 1, as viewed from the major surface 8.

A carrier-recombination-center layer 10 is formed in a deep portion of the substrate 1, in which only the current path A of the power-related element 7 extends. In other words, the carrier-recombination-center layer 10 overlaps the current path A of the power-related element 7 and does not overlap the current B of the logic-related element 9. The layer 10 cannot be formed in such a position by metal diffusion or electron beam radiation, since these methods inevitably form carrier recombination centers in the overall substrate 1.

To avoid this, the present invention employs a method for injecting relatively heavy particles (such as protons or helium nucleus) into the substrate 1. This method enables heavy particles to stop in a portion of the substrate 1 with a desired depth in accordance with the injecting energy. In the case of using protons, for example, they stop in a portion with a depth of about 45 μm from the surface of the substrate 1 if the injecting energy is 2 MeV. Further, in the case of using helium nucleus, they stop in a portion with a depth of about 40 μm from the surface of the substrate 1 if the injecting energy is 6 Mev. Crystal defects form in the vicinity of a region in which the heavy particles stop, and become recombination centers of carriers. Such crystal defects form a layer in the substrate 1 (in the substrate 2 in FIG. 1). This layer corresponds to the carrier-recombination-center layer 10.

It is known that in the above-described method for injecting heavy particles, it is relatively difficult to form crystal defects in a region in which the particles pass. Accordingly, crystal defects can be formed in the substrate 2 by injecting heavy particles from the major surface 8 into the substrate 1. However, it is desirable to inject heavy particles from the reverse side 11 of the substrate 1 in order to avoid influence on the logic-related element 9.

Specific examples of preferable power-related element 7 and logic-related element 9 will now be explained.

Figure 2A:
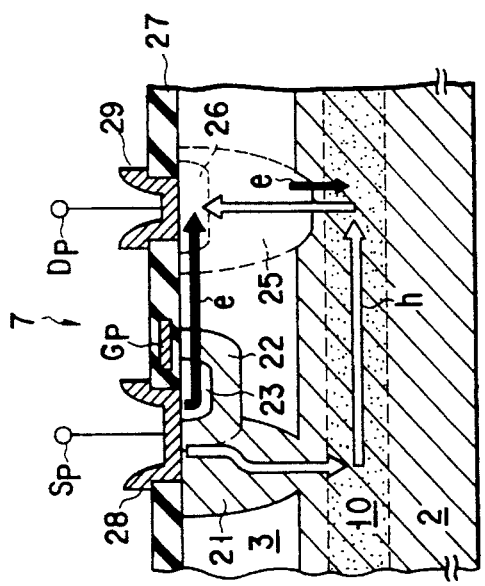
FIG. 2A is a cross sectional view, showing a double-diffusion MOSFET as an example of a preferred power-related element employed in the device of FIG. 1.
Figure 2C:
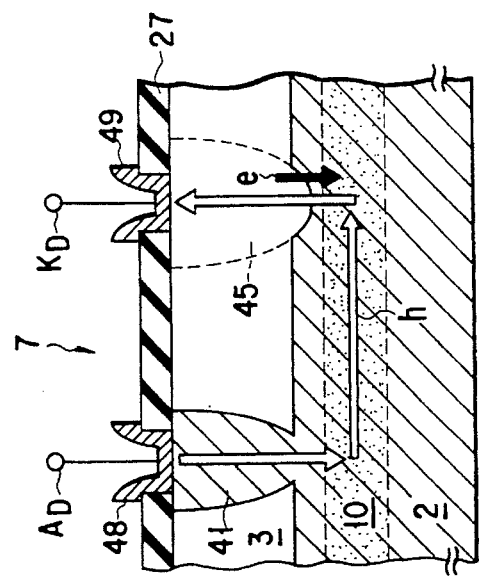
FIG. 2C is a cross sectional view, showing a diode as a further example of the preferred power-related element employed in the device of FIG. 1.
Figure 2B:
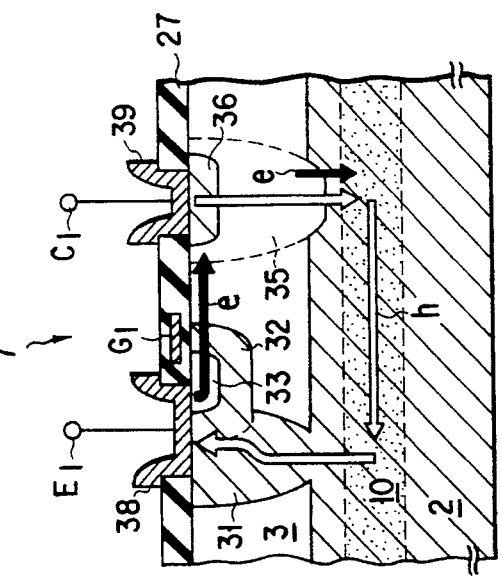
FIG. 2B is a cross sectional view, showing a lateral IGBT as another example of the preferred power-related element employed in the device of FIG. 1.

FIGS. 2A–2C show examples of the power-related element 7 employed in the device of FIG. 1. FIG. 2A is a cross sectional view of a lateral double-diffusion MOSFET (power MOS transistor), FIG. 2B is a cross sectional view of a lateral insulated-gate bipolar transistor (lateral IGBT), and FIG. 2C is a cross sectional view of a diode.

Figure 3A:
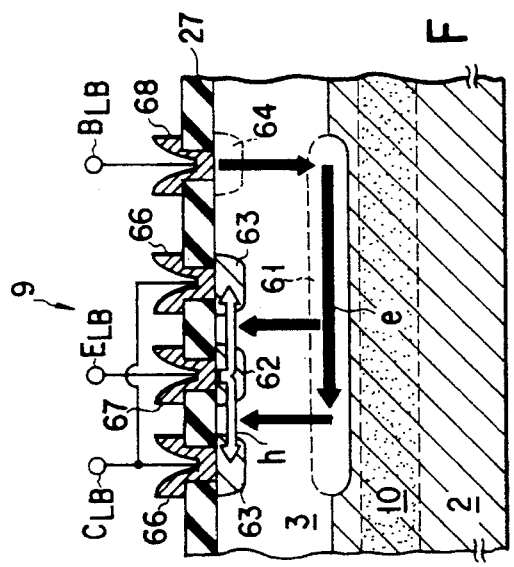
FIG. 3A is a cross sectional view, showing a vertical NPN bipolar transistor as an example of a preferred logic-related element employed in the device of FIG. 1.
Figure 3B:
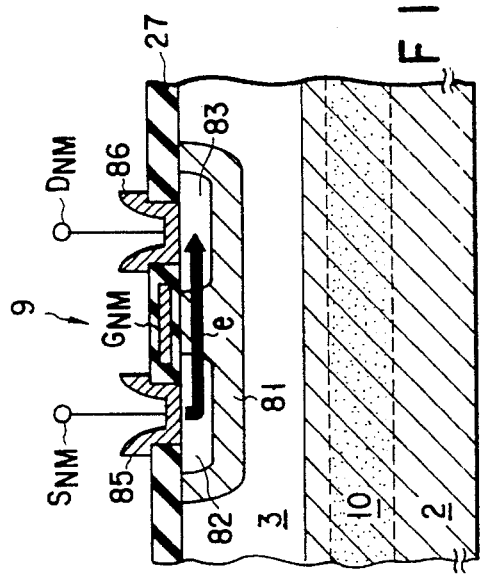
FIG. 3B is a cross sectional view, showing a lateral NPN bipolar transistor as another example of the preferred logic-related element employed in the device of FIG. 1.
Figure 3C:
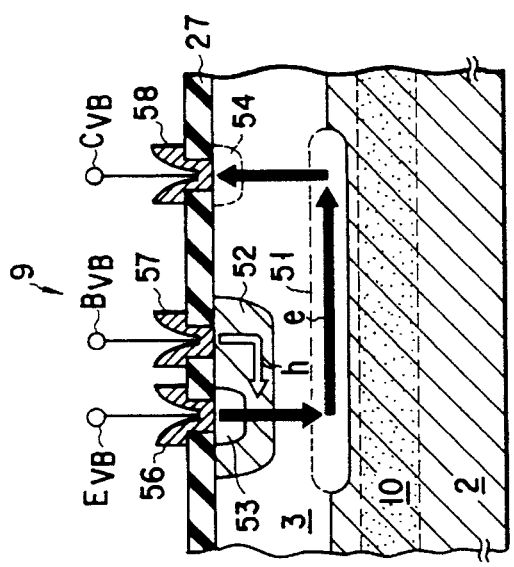
FIG. 3C is a cross sectional view, showing a P-channel MOSFET as a further example of the preferred logic-related element employed in the device of FIG. 1.
Figure 3D:
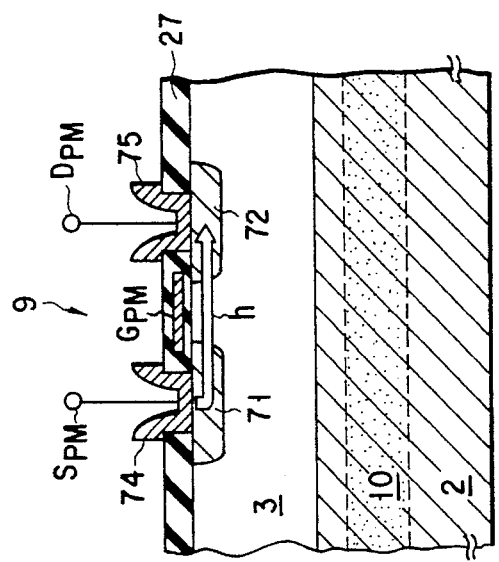
FIG. 3D is a cross sectional view, showing a N-channel MOSFET as a furthermore example of the preferred logic-related element employed in the device of FIG. 1.

Further, FIGS. 3A–3D show examples of the logic-related element 9 employed in the device of FIG. 1. FIG. 3A is a cross sectional view of a vertical NPN bipolar transistor, FIG. 3B is a cross sectional view of a lateral PNP bipolar transistor, FIG. 3C is a cross sectional view of a P-channel MOSFET, and FIG. 3D is a cross sectional view of an N-channel MOSFET.

First, the power MOS transistor as an example of the power-related element 7 will be explained. As is shown in FIG. 2A, a deep $P^+$-type impurity diffusion layer 21 of high density which reaches the P-type silicon substrate 2 and a $P^+$-type impurity diffusion layer 22 which contacts the layer 21 are formed in the N-type epitaxial silicon layer 3. An $N^+$-type impurity diffusion layer 23 of high density, which serves as the source of the power MOS transistor, is formed in the layer 22. A gate insulating film is formed on the $P^+$-type impurity diffusion layer 22 located between the $N^+$-type impurity diffusion layer 23 and the N-type epitaxial silicon layer 3. A gate electrode ($G_p$) is formed on the gate insulating film. Moreover, a deep $N^+$-type impurity diffusion layer 25 of high density which reaches the P-type silicon substrate 2 is formed in the N-type epitaxial silicon layer 3, separated from the diffusion layers 21, 22 and 23. An $N^+$-type contact diffusion layer 26 of a density higher than the diffusion layer 25 is formed in the layer 25.

An insulating film 27 such as a silicon oxide film ($SiO_2$) is formed on the N-type epitaxial silicon layer 3. A first contact hole is formed in the portion of the insulating film 27, which ranges from a portion of the diffusion layer 21 to a portion of the diffusion layer 23. An electrode wire 28 for a source ($S_p$) is electrically connected to the diffusion layers 21, 22 and 23 through the first contact hole. A second contact hole is formed in the portion of the insulating film 27 which is located on the contact diffusion layer 26. An electrode wire 29 for a drain ($D_p$) is electrically connected to the contact diffusion layer 26 through the second contact hole.

The operation of the power MOS transistor constructed as above will now be explained. Where the power MOS transistor is in the On-state, the drain ($D_p$) is at high potential and the source ($S_p$) is at low potential. In this state, a potential of the gate electrode ($G_p$) is higher than the source potential, and a channel is formed in the $P^+$-type impurity diffusion layer 22 located under the gate electrode ($G_p$). Accordingly, electrons(e) flow from the source ($S_p$) to the drain ($D_p$) via the channel.

On the other hand, immediately after the power MOS transistor is switched from the On-state to the Off-state, a diode having its anode connected to the source ($S_p$) and its cathode connected to the drain ($D_p$) is turned on, since a feedback current flows, in particular, in the case of using an induction load such as a motor. In other words, current flows from the $P^+$-type impurity diffusion layer 21 to the $N^+$-type impurity diffusion layer 26 through the P-type silicon substrate 2 and the $N^+$-type impurity diffusion layer 25. This diode is called a "recovery diode (FRD)". In the power MOS transistor, the FRD has a parasitic diode structure in which the P-type silicon substrate 2 and the $P^+$-type impurity diffusion layers 21 and 22 serve as an anode, while the $N^+$-type impurity diffusion layer 25 serves as a cathode.

In the FRD of the parasitic diode structure shown in FIG. 2A, holes(h) serve as majority carriers. Electrons e as minority carriers flow from the $N^+$-type impurity diffusion layer 25, etc. to the P-type silicon substrate 2, while the injected minority carriers (electrons e) exist, the diode is kept on. However, as is shown in FIG. 1, since the recombination center layer 10 is formed in the P-type silicon substrate 2 which serves as the current path of the FRD of the parasitic diode structure, the rate of extinction of the minority carriers (electrons e) is increased. As a result, the operational speed of the FRD is increased. In accordance with the increase in the operational speed of the FRD, the FRD can instantly be shifted from the On-state to the Off-state, thereby increasing the switching speed. At this time, as is shown in FIG. 1, the logic-related element 9 formed in the same substrate 1 as the power-related element 7 has its influence of the life time control should be prevented from being reduced, since the current path B does not extend in the recombination center layer 10.

A lateral IGBT as another example of the power-related element 7 will be explained. As is shown in FIG. 2B, an N-type epitaxial silicon layer 3 has therein a deep and high density $P^+$-type impurity diffusion layer 31 which reaches the P-type silicon substrate 2, and a $P^+$-type impurity diffusion layer 32 which contacts the layer 31. A high density $N^+$-type impurity diffusion layer 33 which functions as the source of the lateral IGBT is formed in the $P^+$-type diffusion layer 32. A gate insulating film is formed on that portion of the layer 32 which is located between the $N^+$-type impurity diffusion layer 33 and the N-type epitaxial silicon layer 3, and a gate electrode ($G_I$) is formed on the gate insulating film. A deep and high density $N^+$-type diffusion layer 35 which reaches the P-type silicon substrate 2 is formed in the N-type epitaxial silicon layer 3, separated from the diffusion layers 31, 32 and 33. A high density $N^+$-type impurity diffusion layer 36 which serves as the collector of the lateral IGBT is formed in the $N^+$-type impurity diffusion layer 35. Further, an insulating film 27 such as a silicon oxide ($SiO_2$) film is formed on the N-type epitaxial silicon layer 3. A first contact hole is formed in that portion of the insulating film 27 which extends on part of the diffusion layers 31, 32 and 33. An emitter ($E_I$) electrode wire 38 is electrically connected to the diffusion layers 31, 32 and 33 through the first contact hole. A second contact hole is formed in that portion of the insulating film 27 which extends on the $N^+$-type diffusion layer 36. A collector ($C_I$) electrode wire 39 is electrically connected to the diffusion layer 36 through the second contact hole.

The operation of the lateral IGBT constructed as above will be explained. Where the collector ($C_I$) is at high potential and the emitter ($E_I$) is at low potential, when a potential of the gate ($G_I$) is higher than the source, a channel is formed in that portion of the $P^+$-type impurity diffusion layer 32 which is located under the gate ($G_I$). As a result, electrons e flow mainly toward the $P^+$-type diffusion layer 35 through the channel. On the other hand, holes are injected into an $N^+$-type impurity diffusion layer 35 on the side of the collector, since the collector side has a PN junction biased in a forward direction. A series of these phenomena causes the layer 35 to have a highly-injected state, thereby reducing the forward saturation voltage of the IGBT. The holes injected from the collector flow into the $P^+$-type impurity diffusion layer 31 through the P-type silicon substrate 2.

In the case of the IGBT shown in FIG. 2B, the holes h serve as majority carriers in the $P^+$-type impurity diffusion layer 31. As in the above-described FRD of the parasitic diode structure, injection of electrons e as the minority carriers from the $N^+$-type impurity diffusion layer 35, etc. to the P-type silicon substrate 2 occurs. The minority carriers (electrons e) reduce the operational speed of the IGBT. However, since in the IGBT, too, the carrier-recombination-center layer 10 is formed in the P-type silicon substrate 2 as shown in FIG. 1, the extinction rate of the minority carriers (electrons e) is increased and the operation speed of the IGBT is accordingly increased. In the IGBT, the influence of the life time control of the logic-related element, which is formed in the same substrate 1 as the IGBT (i.e., the power-related element 7), is prevented from being reduced, as in the power MOS transistor.

A diode as a further example of the power-related element 7 will be explained. As is shown in FIG. 2C, a deep and high density $P^+$-type impurity diffusion layer 41 is formed in the N-type epitaxial silicon layer 3 such that it reaches the P-type silicon substrate 2. Further, a deep and high density $N^+$-type impurity diffusion layer 45 is formed in the N-type epitaxial silicon layer 3 such that it reaches the P-type silicon substrate 2 and is separated from the diffusion layer 41. An insulating film 27 such as a silicon oxide ($SiO_2$) film is formed on the N-type epitaxial silicon layer 3. A first contact hole is formed in that portion of the insulating film 27 which is located on the diffusion layer 41. An anode ($A_D$) electrode wire 48 is electrically connected to the diffusion layer 41 through the first contact hole. A second contact hole is formed in that portion of the insulating film 27 which is located on the diffusion layer 45. A cathode ($K_D$) electrode wire 49 is electrically connected to the diffusion layer 45 through the second contact hole.

The operation of the above-described diode will be explained. Where the anode ($A_D$) is at a high potential and the cathode ($K_D$) is at a low potential, the P-type epitaxial silicon layer 2, the $P^+$-type impurity diffusion layer 41 and the $N^+$-type impurity diffusion layer 45 are biased in potential in a forward direction, with the result that current flows through the diffusion layer 41, the substrate 2 and the diffusion layer 45 in this order.

In the diode shown in FIG. 2C, holes h function as majority carriers, and electrons e as minority carriers flow from the N$^+$-type impurity diffusion layer 45, etc. to the P-type silicon substrate 2, as in the case of the FRD of the parasitic diode structure. These minority carriers (electrons e) may reduce the operation speed of the diode, if there is no carrier-recombination-center layer 10. In other words, in this case, too, the provision of the P-type silicon substrate 2 increases the extinction rate of the minority carriers (electrons e), thereby increasing the operation speed of the diode. It is a matter of course that the current capacity of the logic-related element 9, which is formed in the same substrate 1 as the power-related element 7, is prevented from being reduced, as in the case of the power MOS transistor.

The diode of FIG. 2C may be formed in the same substrate 1 as the lateral IGBT of FIG. 2B, and used as a recovery diode (FRD) for the IGBT. This is because the lateral IGBT cannot have a FRD of a parasitic diode structure as employed in the power MOS transistor.

In the case of using the diode of FIG. 2C as a FRD, the cathode ($K_D$) is connected to the collector ($C_I$) of the IGBT of FIG. 2C by means of a wire layer, and the emitter ($E_I$) is connected to the anode ($A_D$) by means of another wire layer. Connecting the FRD to the lateral IGBT as described above can not only increase the operational speed of the device, but also increase the speed of switching from the On-state to the Off-state. Moreover, in this case, too, the influence of the life time control of the logic-related element 9, which is formed in the same substrate 1 as the power-related element 7, is prevented from being reduced.

The structure of the logic-related element 9 shown in FIG. 1 will be explained. First, a vertical NPN bipolar transistor as an example of the logic-related element 9 will be explained. As is shown in FIG. 3A, a high density N$^+$-type embedded diffusion layer 51 is formed in a boundary region between the P-type silicon substrate 2 and the N-type epitaxial silicon layer 3. A P-type impurity diffusion layer 52 which serves as the base ($B_{VB}$) of the bipolar transistor is formed in the N-type epitaxial silicon layer 3. An N$^+$-type impurity diffusion layer 53 which serves as the emitter ($E_{VB}$) of the bipolar transistor is formed in the P-type impurity diffusion layer 52. Further, a deep and high density N$^+$-type contact diffusion layer 54 is formed in the N-type epitaxial silicon layer 3, separated from the diffusion layer 52. An insulating film 27 such as a silicon oxide (SiO$_2$) film is formed on the N-type epitaxial silicon layer 3. A first contact hole is formed in that portion of the insulating film 27 which is located on the diffusion layer 53. An emitter ($E_{VB}$) electrode wire 56 is electrically connected to the diffusion layer 53 through the first contact hole. A second contact hole is formed in that portion of the insulating film 27 which is located on the diffusion layer 52. A base ($B_{VB}$) electrode wire 57 is electrically connected to the diffusion layer 52 through the second contact hole. A third contact hole is formed in that portion of the insulating film 27 which is located on the diffusion layer 54. A collector ($C_{VB}$) electrode wire 58 is electrically connected to the diffusion layer 54 through the third contact hole.

The operation of the above-described vertical bipolar transistor will be explained. Where the collector ($C_{VB}$) is at a high potential and the emitter ($E_{VB}$) is at a low potential, current is supplied to the base ($B_{VB}$), i.e., holes h are supplied to the P-type impurity diffusion layer 52. Specifically, a bias current is supplied such that a forward current path is formed between the emitter ($E_{VB}$) and the base ($B_{VB}$). As a result, electrons e flow through the N$^+$-type impurity diffusion layer 53, the P-type impurity diffusion layer 52 and the N$^+$-type embedded diffusion layer 51 in this order. In other words, current flows through the diffusion layer 54, the embedded diffusion layer 51, the diffusion layer 52 and the diffusion layer 53 in this order.

Since in the vertical bipolar transistor shown in FIG. 3A, current flows through the N-type epitaxial silicon layer 3 without passing the P-type silicon substrate 2, the $h_{FE}$ (current amplification factor) is prevented from being reduced by the carrier-recombination-center layer 10.

A lateral PNP bipolar transistor as another example of the logic-related element 9 will be explained. As is shown in FIG. 3B, a high density N$^+$-type embedded diffusion layer 61 is formed in a boundary region between the P-type silicon substrate 2 and the N-type epitaxial silicon layer 3. A P-type impurity diffusion layer 62 which serves as the emitter ($E_{LB}$) of the bipolar transistor is formed in the N-type epitaxial silicon layer 3. Further, a P-type impurity diffusion layer 63 which serves as the collector ($C_{LB}$) of the bipolar transistor is formed in the silicon layer 3, separated from the diffusion layer 62 and surrounding the same. Moreover, a deep and high density N$^+$-type contact diffusion layer 64 is formed in the silicon layer 3, separated from the diffusion layers 62 and 63. An insulating film 27 such as a silicon oxide (SiO$_2$) film is formed on the silicon layer 3. A first contact hole (which is, for example, annular) is formed in that portion of the insulating film 27 which is located on the diffusion layer 63. A collector ($C_{LB}$) electrode wire 66 is electrically connected to the diffusion layer 63 through the first contact hole. A second contact hole is formed in that portion of the insulating film 27 which is located on the diffusion layer 62. An emitter ($E_{LB}$) electrode wire 67 is electrically connected to the diffusion layer 62 through the second contact hole. A third contact hole is formed in that portion of the insulating film 27 which is located on the diffusion layer 64. A base ($B_{LB}$) electrode wire 68 is electrically connected to the diffusion layer 64 through the third contact hole.

The operation of the lateral type bipolar transistor constructed as above will be explained. Where the emitter ($E_{LB}$) is at a high potential and the collector ($C_{LB}$) is at a low potential, current is let to flow out of the base (BLB), i.e., electrons e are supplied to the N$^+$-type impurity diffusion layer 64. Specifically, a bias current is supplied such that a backward current path is formed between the emitter ($E_{LB}$) and the base ($B_{LB}$). As a result, holes h flow through the P$^+$-type impurity diffusion layer 62, the N-type epitaxial silicon layer 3 and the P$^+$-type embedded diffusion layer 63 in this order. In other words, current flows through the diffusion layer 62, the silicon layer 3 and the diffusion layer 63 in this order.

Since in the lateral bipolar transistor shown in FIG. 3B, current flows through the N-type epitaxial silicon layer 3 without passing the P-type silicon substrate 2, as in the vertical bipolar transistor of FIG. 3A, the hFE (current amplification factor) is prevented from being reduced by the carrier-recombination-center layer 10.

A P-channel MOSFET as a further example of the logic-related element 9 will be explained. As is shown in FIG. 3C, a P-type impurity diffusion layer 71 which serves as the source ($S_{PM}$) of the MOSFET is formed in the N-type epitaxial silicon layer 3. A P-type impurity diffusion layer 72 which serves as the drain ($D_{PM}$) of the MOSFET is formed in the N-type epitaxial silicon layer 3, separated from the diffusion layer 71. A gate insulating film is formed on the N-type epitaxial silicon layer 3 between the diffusion layers 71 and 72, and a gate electrode ($G_{PM}$) is formed on the gate insulating film. An insulating film 27 such as a silicon oxide ($SiO_2$) film is formed on the silicon layer 3. A first contact hole is formed in that portion of the insulating film 27 which is located on the diffusion layer 71. A source ($S_{PM}$) electrode wire 74 is electrically connected to the diffusion layer 71 through the first contact hole. A second contact hole is formed in that portion of the insulating film 27 which is located on the diffusion layer 72. A drain ($D_{PM}$) electrode wire 75 is electrically connected to the diffusion layer 72 through the second contact hole. The operation of the MOSFET constructed as above will be explained. Where the source ($S_{PM}$) is at a high potential and the drain ($D_{PM}$) is at a low potential, a low potential is supplied to the gate ($G_{PM}$), a channel is formed in the N-type epitaxial silicon layer 3 under the gate, and holes h flow from the diffusion layer 71 to the diffusion layer 72.

As described above, current flows through the N-type epitaxial silicon layer 3 without passing the P-type silicon substrate 2, as in the case of the bipolar transistors, and hence the $v_{th}$ (threshold voltage) is prevented from being shifted by the carrier-recombination-center layer 10.

An N-channel MOSFET as a furthermore example of the logic-related element 9 will be explained. As is shown in FIG. 3D, a P-type well region 81 is formed in the N-type epitaxial silicon layer 3. An N-type impurity diffusion layer 82 which serves as the source ($S_{NM}$) of the MOSFET is formed in the P-type well region 81. An N-type diffusion layer 83 which serves as the drain ($D_{NM}$) of the MOSFET is formed in the silicon layer 3, separated from the diffusion layer 82. A gate insulating film is formed on that portion of the P-type well region 81 which is located between the diffusion layers 82 and 83, and a gate electrode ($G_{NM}$) is formed on the gate insulating film. An insulating film 27 such as a silicon oxide ($SiO_2$) film is formed on the silicon layer 3. A first contact hole is formed in that portion of the insulating film 27 which is located on the diffusion layer 82. A source ($S_{NM}$) electrode wire 85 is electrically connected to the diffusion layer 82 through the first contact hole. A second contact hole is formed in that portion of the insulating film 27 which is located on the diffusion layer 83. A drain ($D_{NM}$) electrode wire 86 is electrically connected to the diffusion layer 83 through the second contact hole.

The operation of the N-channel MOSFET constructed as above will be explained. Where the drain ($D_{NM}$) is at a high potential and the source ($S_{NM}$) is at a low potential, a high potential is supplied to the gate ($G_{NM}$), a channel is formed in the P-type well region 81 under the gate ($G_{NM}$), and electrons e flow from the diffusion layer 82 to the diffusion layer 83. Thus, current flows through the N-type epitaxial silicon layer 3 without passing the P-type silicon substrate 2, as in the case of the bipolar transistors, and hence the $v_{th}$ (threshold voltage) is prevented from being shifted by the carrier-recombination-center layer 10.

Figure 4:
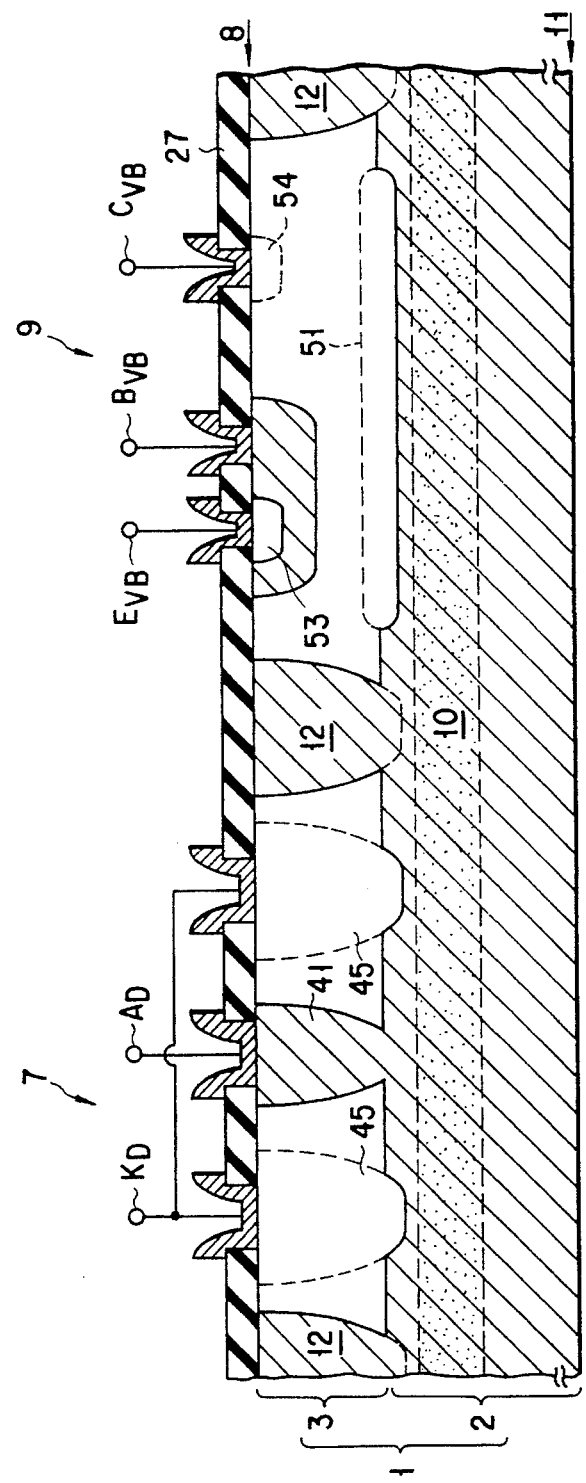
FIG. 4 is a cross sectional view, showing a specific example of the semiconductor integrated circuit device of FIG. 1.

FIG. 4 is a cross sectional view, more specifically showing the semiconductor integrated circuit device of FIG. 1. In the device of FIG. 4, a diode is used as the power-related element 7, and a vertical NPN bipolar transistor is used as the logic-related element 9. The P-type silicon region 4 which separates the power-related element 9 from the logic-related element 7 is a diffusion layer formed by diffusing a P-type impurity from the major surface 8 of the substrate 1, i.e., the surface of the N-type epitaxial silicon layer 3.

Since in the above structure, the carrier-recombination-center layer 10 overlaps the current path of a diode as the power-related element 7, the diode can operate at high speed. On the other hand, since the current path of the vertical NPN transistor as the logic-related element 9 is located in a shallow portion of the N-type epitaxial silicon layer 3, it is not adversely affected by the carrier-recombination-center layer 10, thereby reducing the influence of the life time control.

In the semiconductor integrated circuit device according to the first embodiment, the power-related element 7 shown in FIG. 1 is selected from the elements having current paths formed in deep portions of the substrate as shown in FIGS. 2A–2C, respectively; and the logic-related 9 is selected from the elements having current paths formed in shallow portions of the substrate as shown in FIGS. 3A–3D, respectively. In any combination of the power-related element 7 and the logic-related element 9, provision of the carrier-recombination-center layer 10 in a deep portion of a substrate can satisfy both the demand that the power-related element 7 be operated at high speed, and the demand that the logic-related element 9 have a sufficient current capacity.

Figure 5:
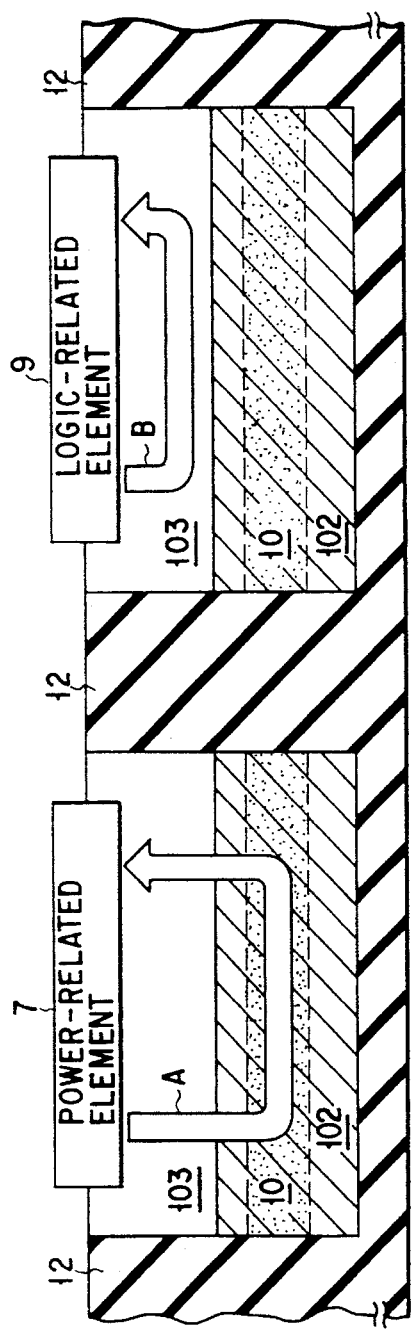
FIG. 5 is a schematic cross sectional view, showing a semiconductor integrated circuit device according to a second embodiment of the invention.

FIG. 5 is a cross sectional view, showing a semiconductor integrated circuit device according to a second embodiment of the invention. As described above, in the first embodiment, the P-type silicon region 4 is formed in the N-type epitaxial silicon layer 3 such that it reaches the P-type silicon substrate 2, thereby separating only the silicon layer 3 into two portions by PN junction. On the other hand, in the second embodiment, a laminated structure of a P-type silicon layer 102 and an N-type silicon layer 103 is isolatedly separated into two portions by a dielectric region 12. The P-type silicon layer 102 corresponds to the P-type silicon substrate 2 of FIG. 1, and therefore has the carrier-recombination-center layer 10 formed therein. Further, the N-type silicon layer 103 corresponds to the N-type epitaxial silicon layer 3 of FIG. 1.

As described above, isolating the power-related element 7 from the logic-related element 9, together with the P-type silicon layer 102 having the carrier-recombination-center layer 10 formed therein, increases the degree of insulation between the elements 7 and 9 as compared with the first embodiment.

Figure 6:
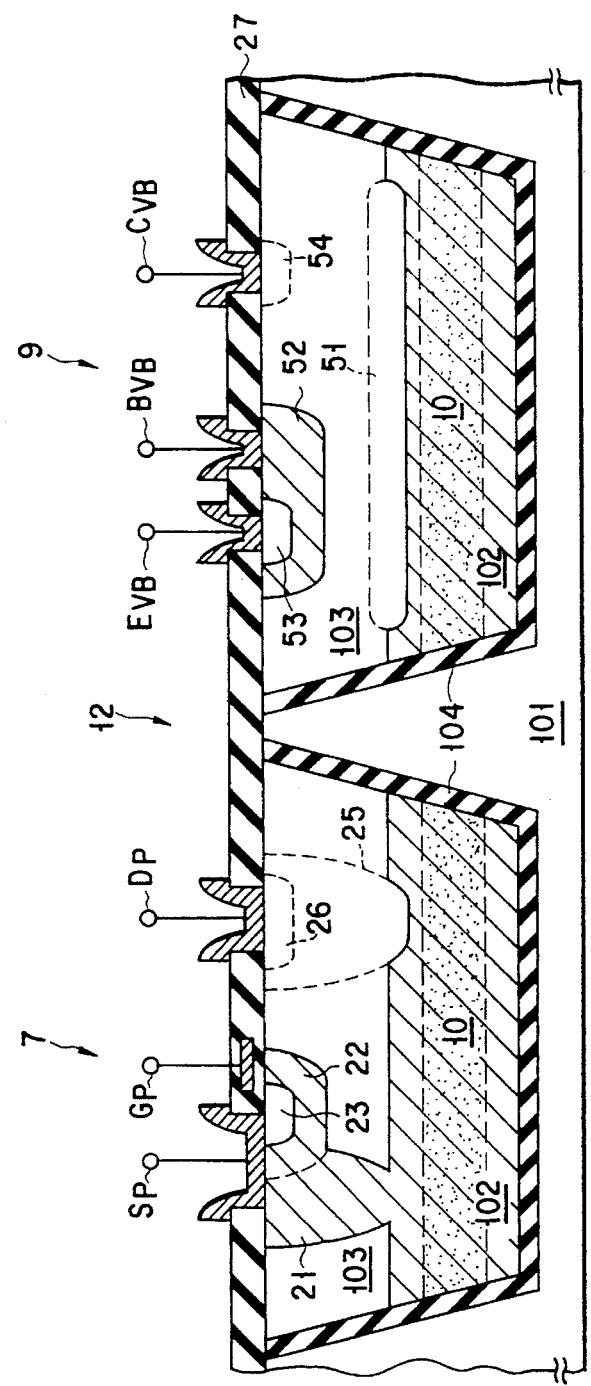
FIG. 6 is a cross sectional view, showing a specific example of the semiconductor integrated circuit device of FIG. 5.

FIG. 6 is a cross sectional view, showing a specific example of the semiconductor integrated circuit device of FIG. 5. In this case, a power MOS transistor is used as the power-related element 7 and a vertical NPN bipolar transistor is used as the logic-related element 9. Further, a complete dielectric isolation substrate is used in the FIG. 6 device. This substrate type is called an "EPIC" (Epitaxial Passivated Integrated Circuit: a registered trademark of US Motoroller Corporation) type.

Specifically, this device includes a supporting polysilicon substrate 101 having an isolating projection of a tapered cross section. The isolating projection of the substrate 101 isolates regions, each of which has a laminated structure portion consisting of a P-type silicon layer 102 and an N-type silicon layer 103. silicon oxide films ($SiO_2$) 104 which correspond to the dielectric region 12 in FIG. 5 are formed on surface portions of the supporting polysilicon substrate 101.

Figure 7:
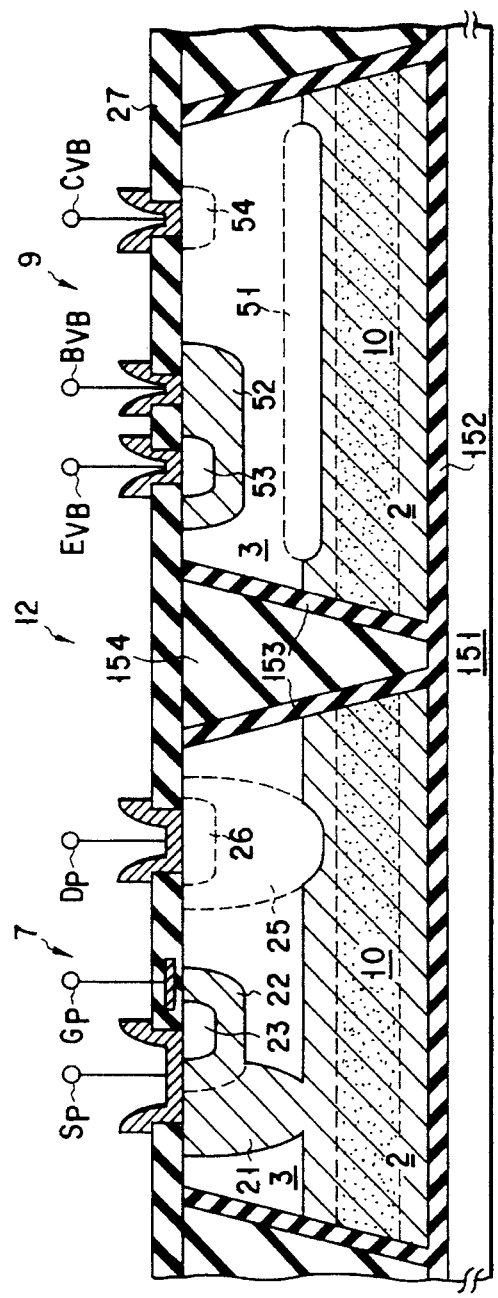
FIG. 7 is a cross sectional view, showing another specific example of the semiconductor integrated circuit device of FIG. 5.

FIG. 7 is a cross sectional view, showing another specific example of the semiconductor integrated circuit device of FIG. 5. In this case, too, a power MOS transistor is used as the power-related element 7 and a vertical NPN bipolar transistor is used as the logic-related element 9. Further, a dielectric isolation lamination substrate is used in the FIG. 7 device. This substrate type is called an "SDB" (Silicon wafer Direct Bonding) type, in which two silicon substrate are bonded to each other by means of a silicon oxide film. Specifically, first, a first silicon substrate 151 is coated with a silicon oxide film (SiO$_2$) 152 by thermally oxidizing the surface of the substrate 151 or depositing thereon a silicon dioxide. Then, a second P-type silicon substrate 2 is adhered to the oxide film 152, and an N-type epitaxial silicon layer 3 is formed on the silicon substrate 2. Thereafter, a trench is formed such that it extends through the silicon layer 3 and the silicon substrate 2 and reaches the oxide film 152. When isotropic etching such as a CDE has been used, a trench with a cross section as shown in FIG. 7 is obtained. In other words, the trench thus obtained has a wide opening and a narrow bottom. Actually, a plurality of such trenches are formed in a grid pattern (not shown), thereby defining island regions each of which has a laminated structure of the silicon substrate 2 and the silicon layer 3. Thereafter, silicon oxide films (SiO$_2$) 153 are formed, by thermal oxidation or by the deposition of a silicon dioxide, on those side portions of the silicon substrate 2 and the silicon layer 3 which are exposed in the trench. Subsequently, the trench is filled with a polysilicon layer 154. In this case, the silicon oxide films 152 and 153 correspond to the dielectric region 12 of FIG. 12.

As explained above, a dielectric isolation type substrate can be used.

Figure 8:
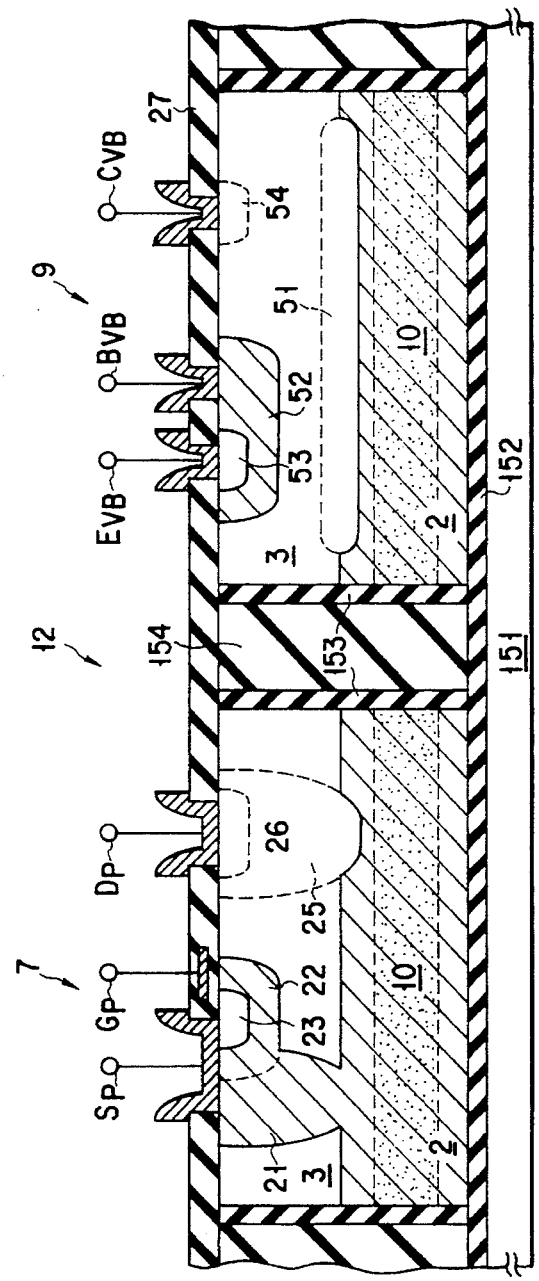
FIG. 8 is a cross sectional view, showing a further specific example of the semiconductor integrated circuit device of FIG. 5.

FIG. 8 is a cross sectional view, showing a further example of the semiconductor integrated circuit device of FIG. 5. In this case, too, a power MOS transistor is used as the power-related element 7 and a vertical NPN bipolar transistor is used as the logic-related element 9. In the FIG. 8 device, the power-related element 7 (the power MOS transistor) is isolated from the logic-related element 9 (the vertical NPN bipolar transistor) by means of a trench formed by anisotropic etching such as RIE. The trench formed by anisotropic etching has a cross section as shown in FIG. 8, i.e., the trench has an opening and a bottom whose sizes are substantially equal to each other. The other basic structure of the FIG. 8 device is similar to that of FIG. 7. Therefore, like element is denoted by like reference numeral, and no detailed explanation will be given of.

Even where element isolation is performed by the use of a trench as shown in FIG. 8, substantially the same advantage as that of the FIG. 7 device can be obtained.

In the above-described second embodiment, the carrier-recombination-center layer 10 can be formed by the following method, as well as by injecting heavy particles:

In this method, crystal defects are beforehand formed in at least one of the P-type silicon substrate 2 and the P-type silicon layer 102. To form crystal defects, for example, a high density impurity layer is formed by injecting ions of high density. In this case, however, the impurity layer can be formed only in a shallow portion of the substrate as compared with the case of injecting heavy particles. To form such an impurity layer in the structure of FIG. 6, the impurity layer is formed in a bottom portion of the island region along the silicon oxide film 104. Further, in the cases of FIGS. 7 and 8, the impurity layer is formed in a bottom portion of the substrate 2 along the oxide film 152.

As explained above, in the case of forming a high density impurity layer by injecting ions of high density, the power-related element 7 is formed at a location at which its current path extends in the high density impurity layer, while the logic-related element 9 is formed at a location at which its current path does not extend in the high density impurity layer. This structure can simultaneously satisfy both a demand for an increase in the switching speed of the power-related element 7 and a demand for reducing the influence of the life time control on the logic-related element 9.

Although in the second embodiment, a power MOS transistor is used as the power-related element 7 and a vertical NPN bipolar transistor is used as the logic-related element 9, the elements 7 and 9 may be identical to those employed in the first embodiment. In other words, the element 7 may be selected from the elements having current paths formed in deep portions of the substrate as shown in FIGS. 2A–2C, respectively; and the element 9 may be selected from the elements having current paths formed in shallow portions of the substrate as shown in FIGS. 3A–3D, respectively. In any combination of the power-related element 7 and the logic-related element 9, provision of the carrier-recombination-center layer 10 in a deep portion of the substrate can provide a semiconductor integrated circuit device wherein both an element of high switching speed and an element which the influence of the life time control should be prevented are formed in a single chip.

Moreover, the invention is not limited to the above-described embodiments, but can be modified in various manners without departing the scope thereof. Although, for example, an IPD is used as an example of a semiconductor integrated circuit device in the first and second embodiments, it is a matter of course that the invention is also applicable to another type semiconductor integrated circuit device, only if the device is demanded to have an element of high operation speed and an element which the influence of the life time control should be prevented.

What is claimed is:

1. A semiconductor integrated circuit device comprising:

a semiconductor substrate;

a first element formed in the semiconductor substrate and having a first current path in a first portion of the semiconductor substrate;

a second element formed in the semiconductor substrate separated from the first element and having a second current path in a second portion of the semiconductor substrate; and a carrier-recombination-center layer formed in said first portion of the semiconductor substrate, wherein the semiconductor substrate includes a first semiconductor layer of a first conductivity type, a second semiconductor layer of a second conductivity type formed on the first semiconductor layer, and an isolating region isolatately separating the second semiconductor layer into a first island region and a second island region, the first element having the first current path extending in the first island region and the first semiconductor layer, the second element having the second current path extending in the second island region, and the carrier-recombination-center layer being formed in the first semiconductor layer.

2. The semiconductor integrated circuit device according to claim 1, wherein the isolating region is a first-conductivity type semiconductor region which extends from a major surface of the second semiconductor layer to the first semiconductor.

3. The semiconductor integrated circuit device according to claim 1, wherein the first element is a power element, and the second element is a logic element.

4. The semiconductor integrated circuit device according to claim 3, wherein the power element is selected from the group consisting of a lateral double-diffusion MOSFET, a lateral insulated-gate bipolar transistor, and a diode.

5. The semiconductor integrated circuit device according to claim 3, wherein the logic element is selected from the group consisting of a vertical NPN bipolar transistor, a lateral NPN bipolar transistor, a p-channel MOSFET, and an N-channel MOSFET.

6. The semiconductor integrated circuit device according to claim 1, wherein the carrier-recombination center layer is a crystal defect layer.

7. A semiconductor integrated circuit device comprising:
a semiconductor substrate;
a first element formed in the semiconductor substrate and having a first current path in a first portion of the semiconductor substrate;
a second element formed in the semiconductor substrate separated from the first element and having a second current path in a second portion of the semiconductor substrate; and
a carrier-recombination-center layer formed in said first portion of the semiconductor substrate, wherein the semiconductor substrate includes a first semiconductor layer of a first conductivity type, a second semiconductor layer of a second conductivity type laminated on the first semiconductor layer, and an dielectric region isolatately separating the laminated structure of the first and second semiconductor layers into a first island region and a second island region, the first element having the first current path extending in portions of the second and first semiconductor layers which are located in the first island region, the second element having the second current path extending in a portion of the second semiconductor layer which is located in the second island region, and the carrier-recombination-center layer being formed in portions of the first semiconductor layer which are located in a first and second island regions.

8. The semiconductor integrated circuit device according to claim 7, wherein the first element is a power element, and the second element is a logic element.

9. The semiconductor integrated circuit device according to claim 8, wherein the power element is selected from the group consisting of a lateral double-diffusion MOSFET, a lateral insulated-gate bipolar transistor, and a diode.

10. The semiconductor integrated circuit device according to claim 8, wherein the logic element is selected from the group consisting of a vertical NPN bipolar transistor, a lateral NPN bipolar transistor, a p-channel MOSFET, and an N-channel MOSFET.

11. The semiconductor integrated circuit device according to claim 7, wherein the carrier-recombination center layer is a crystal defect layer.

12. The semiconductor integrated circuit device comprising:
a semiconductor substrate;
a first element formed in the semiconductor substrate and having a first current path in a first portion of the semiconductor substrate;
a second element formed in the semiconductor substrate separated from the first element and having a second current path in a second portion of the semiconductor substrate; and
a carrier-recombination-center layer formed in said first portion of the semiconductor substrate, wherein said semiconductor substrate includes a first semiconductor substrate, a first insulating layer formed in the first semiconductor substrate, a second semiconductor substrate formed on the first semiconductor substrate with the first insulating layer interposed therebetween, a trench isolatately separating the second semiconductor substrate into a first island region and a second island region, and a second insulating layer formed in the trench, the first element being formed in the first island region and the second element being formed in the second island region.

13. The semiconductor integrated circuit device according to claim 12, wherein the first island region includes a first semiconductor region of a first conductivity type and a second semiconductor region of a second conductivity type formed on the first semiconductor region; the first element has the first current path extending in the first and second semiconductor regions; the second island region includes a third semiconductor region of a first conductivity type and a fourth semiconductor region of a second conductivity type; the second element has the second current path extending in the fourth semiconductor region; and the carrier-recombination-center layer is formed in the first and third semiconductor regions.

14. The semiconductor integrated circuit device according to claim 12, wherein the first element is a power element, and the second element is a logic element.

15. The semiconductor integrated circuit device according to claim 14, wherein the power element is selected from the group consisting of a lateral double-diffusion MOSFET, a lateral insulated-gate bipolar transistor, and a diode.

16. The semiconductor integrated circuit device according to claim 14, wherein the logic element is selected from the group consisting of a vertical NPN bipolar transistor, a lateral NPN bipolar transistor, a p-channel MOSFET, and an N-channel MOSFET.

17. The semiconductor integrated circuit device according to claim 12, wherein the carrier-recombination center layer is a crystal defect layer.

18. A semiconductor integrated circuit device comprising:
a semiconductor substrate;
a first element formed in the semiconductor substrate and having a first current path in a first portion of the semiconductor substrate;
a second element formed in the semiconductor substrate and having a second current path in a second portion of the semiconductor substrate;
an isolation region formed in a semiconductor substrate which electrically isolates the first and second elements from each other; and
a carrier-recombination-center layer formed in said first portion of the semiconductor substrate, wherein the semiconductor substrate includes a first semiconductor layer of a first conductivity type, a second semiconductor layer of a second conductivity type formed on the first semiconductor layer, and an isolating region isolatately separating the second semiconductor layer into a first island region and a second island region, the first element having the first current path extending in the first island region and the first semiconductor layer, the second element having the second current path extending in the second island region, and the carrier-recombination-center layer being formed in the first semiconductor layer.

19. The semiconductor integrated circuit device according to claim 18, wherein the first element is a power element, and the second element is a logic element.

20. The semiconductor integrated circuit device according to claim 19, wherein the power element is selected from the group consisting of a lateral double-diffusion MOSFET, a lateral insulated-gate bipolar transistor, and a diode.

21. The semiconductor integrated circuit device according to claim 19, wherein the logic element is selected from the group consisting of a vertical NPN bipolar transistor, a lateral NPN bipolar transistor, a p-channel MOSFET, and an N-channel MOSFET.

22. The semiconductor integrated circuit device according to claim 18, wherein the carrier-recombination center layer is a crystal defect layer.

23. A semiconductor integrated circuit device comprising:

a semiconductor substrate;

a first element formed in the semiconductor substrate and having a first current path in a first portion of the semiconductor substrate;

a second element formed in the semiconductor substrate and having a second current path and a second portion of the semiconductor substrate;

an isolation region formed in the semiconductor substrate which electrically isolates the first and second elements from each other; and a carrier-recombination-center layer formed in said first portion of the semiconductor substrate, wherein the semiconductor substrate includes a first semiconductor layer of a first conductivity type, a second semiconductor layer of a second conductivity type laminated on the first semiconductor layer, and an isolation region has a dielectric region isolately separating the laminated structure of the first and second semiconductor layers into a first island region and a second island region, the first element having the first current path extending in portions of the second and first semiconductor layers which are located in the first island region, the second element having the second current path extending in a portion of the second semiconductor layer which is located in the second island region, and the carrier-recombination-center layer is formed in each of the portions of the first semiconductor layer which are located in the first and second island regions.

24. The semiconductor integrated circuit device according to claim 23, wherein the first element is a power element, and the second element is a logic element.

25. The semiconductor integrated circuit device according to claim 24, wherein the power element is selected from the group consisting of a lateral double-diffusion MOSFET, a lateral insulated-gate bipolar transistor, and a diode.

26. The semiconductor integrated circuit device according to claim 24, wherein the logic element is selected from the group consisting of a vertical NPN bipolar transistor, a lateral NPN bipolar transistor, a p-channel MOSFET, and an N-channel MOSFET.

27. The semiconductor integrated circuit device according to claim 23, wherein the carrier-recombination center layer is a crystal defect layer.

28. A semiconductor integrated circuit device comprising:

a semiconductor substrate;

a first element formed in the semiconductor substrate and having a first current path in a first portion of the semiconductor substrate;

a second element formed in the semiconductor substrate and having a second current path in a second portion of the semiconductor substrate;

an isolation region formed in the semiconductor substrate and which electrically isolates the first and second elements from each other; and a carrier-recombination-center layer formed in said first portion of the semiconductor substrate, wherein the semiconductor substrate includes a first semiconductor substrate, a first insulating film formed on the first semiconductor substrate, and a second semiconductor substrate formed on the first semiconductor substrate with the first insulating layer interposed therebetween, the isolating region have a trench isolately separating the second semiconductor substrate into a first island region and a second island region, and a second insulating layer formed in the trench, the first element is formed in the first island region and the first element is formed in the second island region.

29. The semiconductor integrated circuit device according to claim 28, wherein the first island region includes a first semiconductor region of a first conductivity type and a second semiconductor region of a second conductivity type formed on the first semiconductor region, the first element has the first current path extending in the first and second semiconductor regions, the second island region includes a third semiconductor region of a first conductivity type and a fourth semiconductor region of a second conductivity type located above the third semiconductor region, the second element has the second current path extending in the fourth semiconductor region, and the carrier-recombination-center layer is formed in the first and third semiconductor regions.

30. The semiconductor integrated circuit device according to claim 28, wherein the first element is a power element, and the second element is a logic element.

31. The semiconductor integrated circuit device according to claim 30, wherein the power element is selected from the group consisting of a lateral double-diffusion MOSFET, a lateral insulated-gate bipolar transistor, and a diode.

32. The semiconductor integrated circuit device according to claim 30, wherein the logic element is selected from the group consisting of a vertical NPN bipolar transistor, a lateral NPN bipolar transistor, a p-channel MOSFET, and an N-channel MOSFET.

33. The semiconductor integrated circuit device according to claim 28, wherein the carrier-recombination center layer is a crystal defect layer.

* * * * *